(12) United States Patent
Shimayama et al.

(10) Patent No.: US 8,759,222 B2
(45) Date of Patent: Jun. 24, 2014

(54) METHOD FOR FABRICATION OF SEMICONDUCTOR DEVICE

(75) Inventors: Tsutomu Shimayama, Kanagawa (JP); Takatoshi Kameshima, Kanagawa (JP); Masaki Okamoto, Kanagawa (JP)

(73) Assignee: Sony Corporation (JP)

( * ) Notice: Subject to any disclaimer, the term of this patent is extended or adjusted under 35 U.S.C. 154(b) by 1738 days.

(21) Appl. No.: 11/680,709

(22) Filed: Mar. 1, 2007

(65) Prior Publication Data

US 2008/0254631 A1    Oct. 16, 2008

(30) Foreign Application Priority Data

Mar. 15, 2006  (JP) ................. P2006-070272

(51) Int. Cl.
*H01L 21/311* (2006.01)

(52) U.S. Cl.
USPC .............................................. 438/700

(58) Field of Classification Search
None
See application file for complete search history.

(56) References Cited

U.S. PATENT DOCUMENTS

| | | | | |
|---|---|---|---|---|
| 5,550,405 A * | 8/1996 | Cheung et al. | ............. | 257/642 |
| 5,561,318 A * | 10/1996 | Gnade et al. | ................. | 257/638 |
| 5,776,990 A * | 7/1998 | Hedrick et al. | ................. | 521/77 |
| 5,895,263 A * | 4/1999 | Carter et al. | ................. | 438/624 |
| 5,965,679 A * | 10/1999 | Godschalx et al. | .......... | 526/281 |
| 6,271,273 B1 * | 8/2001 | You et al. | ......................... | 521/61 |
| 6,383,920 B1 * | 5/2002 | Wang et al. | ................. | 438/639 |
| 6,420,441 B1 * | 7/2002 | Allen et al. | ................. | 521/77 |
| 6,448,176 B1 * | 9/2002 | Grill et al. | ................. | 438/637 |
| 6,451,712 B1 * | 9/2002 | Dalton et al. | ................. | 438/781 |
| 6,528,409 B1 * | 3/2003 | Lopatin et al. | ................. | 438/618 |
| 6,603,204 B2 * | 8/2003 | Gates et al. | ................. | 257/760 |
| 6,630,520 B1 * | 10/2003 | Bruza et al. | ................. | 521/77 |
| 6,716,742 B2 * | 4/2004 | Gates et al. | ................. | 438/623 |
| 6,783,862 B2 * | 8/2004 | Hedrick et al. | ................. | 428/447 |
| 6,831,003 B1 * | 12/2004 | Huang et al. | ................. | 438/627 |
| 6,831,364 B2 * | 12/2004 | Dalton et al. | ................. | 257/758 |
| 6,831,366 B2 * | 12/2004 | Gates et al. | ................. | 257/760 |
| 6,844,257 B2 * | 1/2005 | Fornof et al. | ................. | 438/634 |
| 6,933,586 B2 * | 8/2005 | Fornof et al. | ................. | 257/508 |
| 6,998,325 B2 * | 2/2006 | Yunogami et al. | ........... | 438/409 |

(Continued)

FOREIGN PATENT DOCUMENTS

| | | |
|---|---|---|
| JP | 2000-216153 | 8/2000 |
| JP | 2001-110789 | 4/2001 |

(Continued)

OTHER PUBLICATIONS

Golden, J. H., et al., Designing Porous Low-k Dielectrics, Semiconductor International, May 2001.*

(Continued)

*Primary Examiner* — David E Graybill
(74) *Attorney, Agent, or Firm* — Sheridan Ross P.C.

(57) ABSTRACT

Disclosed herein is a method for fabrication of semiconductor device involving a first step of coating the substrate with a double-layered insulating film in laminate structure having the skeletal structure of inorganic material and a second step of etching the upper layer of the insulating film as far as the lower layer of the insulating film. In the method for fabrication of semiconductor device, the first step is carried out in such a way that the skeletal structure is incorporated with a pore-forming material of hydrocarbon compound so that one layer of the insulating film contains more carbon than the other layer of the insulating film.

8 Claims, 12 Drawing Sheets

(56) References Cited

U.S. PATENT DOCUMENTS

| | | | |
|---|---|---|---|
| 7,034,380 B2* | 4/2006 | Andideh | 257/635 |
| 7,064,060 B2* | 6/2006 | Misawa et al. | 438/637 |
| 7,125,793 B2* | 10/2006 | Liou et al. | 438/637 |
| 2002/0030297 A1* | 3/2002 | Gallagher et al. | 264/49 |
| 2002/0074659 A1* | 6/2002 | Dalton et al. | 257/758 |
| 2002/0117760 A1* | 8/2002 | Gates et al. | 257/774 |
| 2003/0057414 A1* | 3/2003 | Dalton et al. | 257/3 |
| 2003/0059723 A1* | 3/2003 | Gallagher et al. | 430/311 |
| 2003/0083392 A1* | 5/2003 | Bruza et al. | 521/77 |
| 2003/0092785 A1* | 5/2003 | Bruza et al. | 521/77 |
| 2003/0111263 A1* | 6/2003 | Fornof et al. | 174/262 |
| 2003/0114013 A1* | 6/2003 | Hedrick et al. | 438/734 |
| 2003/0165625 A1* | 9/2003 | So et al. | 427/385.5 |
| 2003/0186168 A1* | 10/2003 | Gallagher et al. | 430/296 |
| 2003/0186169 A1* | 10/2003 | Gallagher et al. | 430/296 |
| 2003/0218253 A1* | 11/2003 | Avanzino et al. | 257/758 |
| 2003/0219968 A1* | 11/2003 | Adem et al. | 438/622 |
| 2004/0018717 A1* | 1/2004 | Fornof et al. | 438/624 |
| 2004/0052948 A1* | 3/2004 | Gronbeck et al. | 427/299 |
| 2004/0061201 A1* | 4/2004 | Andideh | 257/635 |
| 2004/0084778 A1* | 5/2004 | Hosoda et al. | 257/758 |
| 2004/0102032 A1* | 5/2004 | Kloster et al. | 438/623 |
| 2004/0130032 A1* | 7/2004 | Gronbeck et al. | 257/759 |
| 2004/0137153 A1* | 7/2004 | Thomas et al. | 427/384 |
| 2004/0161922 A1* | 8/2004 | Gallagher et al. | 438/623 |
| 2005/0014855 A1* | 1/2005 | Bruza et al. | 521/77 |
| 2005/0040532 A1* | 2/2005 | Kumar et al. | 257/758 |
| 2005/0101157 A1* | 5/2005 | Yunogami et al. | 438/781 |
| 2005/0171277 A1* | 8/2005 | Li et al. | 524/588 |
| 2005/0255678 A1* | 11/2005 | Kato | 438/478 |
| 2005/0258542 A1* | 11/2005 | Fuller et al. | 257/759 |
| 2005/0277755 A1* | 12/2005 | Hamada et al. | 528/32 |
| 2006/0073423 A1* | 4/2006 | Gallagher | 430/320 |
| 2006/0118961 A1* | 6/2006 | Kumar et al. | 257/759 |
| 2006/0182881 A1* | 8/2006 | Montano et al. | 427/162 |
| 2006/0192193 A1* | 8/2006 | Lee et al. | 257/2 |
| 2006/0205203 A1* | 9/2006 | Lu et al. | 438/624 |
| 2006/0211256 A1* | 9/2006 | Takei et al. | 438/725 |
| 2006/0216920 A1* | 9/2006 | Kojima | 438/618 |
| 2007/0173070 A1* | 7/2007 | Chen et al. | 438/778 |
| 2007/0272123 A1* | 11/2007 | Kennedy et al. | 106/287.1 |
| 2008/0014841 A1* | 1/2008 | Ronay | 451/41 |
| 2008/0254631 A1* | 10/2008 | Shimayama et al. | 438/700 |

FOREIGN PATENT DOCUMENTS

| | | |
|---|---|---|
| JP | 2004-063859 | 2/2004 |
| JP | 2004-274020 | 9/2004 |
| JP | 2004-274052 | 9/2004 |

OTHER PUBLICATIONS

Peters, L., Industry Divides on Low-k Dielectric Choices, Semiconductor International, Jul. 2001.*

* cited by examiner

METHOD FOR FABRICATION OF SEMICONDUCTOR DEVICE

CROSS REFERENCES TO RELATED APPLICATIONS

The present invention contains subject matter related to Japanese Patent Application JP 2006-070272 filed in the Japanese Patent Office on Mar. 15, 2006, the entire contents of which being incorporated herein by reference.

BACKGROUND OF THE INVENTION

1. Field of the Invention

The present invention relates to a method for fabrication of a semiconductor device and, more particularly, to a method for fabrication of a semiconductor device having a porous insulating film.

2. Description of the Related Art

Recent semiconductor devices with a higher degree of integration and scale down than before pose a serious problem with delay of electric signals resulting from the time constant of wiring. This problem is addressed by making the wiring of multi-layer structure from low-resistance copper (Cu) in place of aluminum (Al). Unfortunately, copper hardly undergoes dry etching for patterning unlike any other metallic materials, such as aluminum, which are used for the multi-layer wiring structure in the past. This disadvantage is overcome by employing the damascene method, which consists of forming wiring grooves in an insulating film and embedding a copper film in the wiring groove, thereby forming the wiring pattern.

The foregoing steps can be achieved more efficiently by the dual-damascene method, which consists of forming via holes and wiring grooves and then embedding copper therein simultaneously. This method is attracting attention because it effectively reduces the number of steps.

Highly integrated semiconductor devices are subject to slow-down due to increased capacity between wirings; therefore, they inevitably need fine multi-layer wirings, with the capacity between wirings kept low by interlayer insulating film of so-called low-dielectric material. Examples of such materials include fluorine-containing silicon oxide (FSG) having a dielectric constant of about 3.5, organic polymers typified by polyarylether (PAE), and inorganic silicon compounds typified by carbon-containing silicon oxide (SiOC), hydrogen silsesquioxane (HSQ), and methyl silsesquioxane (MSQ), which have a lower dielectric constant than silicon oxide. Moreover, attempts are being made to further reduce their dielectric constant to about 2.3 by making them porous.

The dual-damascene method mentioned above is applied to the interlayer insulating film having a low dielectric constant by the steps of forming a film of inorganic material (SiOC) on the substrate by chemical vapor deposition (CVD) process, forming a film of organic material (PAE) on the inorganic film by coating, forming wiring grooves in the organic film by etching, and forming via holes in the inorganic film. The thus formed layer structure has an interface between the inorganic film and the organic film and hence permits etching to be performed under good control with a high etching selective ratio of the former to the latter. (See Japanese Patent Laid-Open No. 2004-63859, for instance).

Moreover, CVD process to form the inorganic film can readily adapt itself to varied conditions (gas flow rate and RF power) to cope with fluctuation of film quality, and CVD process usually gives rise to a compact film with high mechanical strength.

SUMMARY OF THE INVENTION

The above-mentioned fabricating method, however, needs an additional step of moving the substrate from one apparatus for CVD process to form the inorganic film to the other apparatus for coating to form the organic film. This step is troublesome and detrimental to productivity. CVD process having such an advantage is hardly applicable to the organic film as the insulating film for the upper layer in which the wiring grooves are formed. Unfortunately, porous SiOC film is the inorganic film comparable to the organic film in dielectric constant, but it does not match the SiOC lower layer in etching selective ratio. This poses a problem with poor processing controllability.

It is desirable to provide a method for fabrication of a semiconductor device, the method giving laminated films by CVD process such that the upper layer undergoes etching more easily than the lower layer.

The gist of the present invention resides in a method for fabrication of semiconductor devices involving a first step of coating the substrate with a double-layered insulating film in laminate structure having the skeletal structure of inorganic material and a second step of etching the upper layer of the insulating film as far as the lower layer of the insulating film. In the method for fabrication of semiconductor device, the first step is carried out in such a way that the skeletal structure is incorporated with a pore-forming material of hydrocarbon compound so that one layer of the insulating film contains more carbon than the other layer of the insulating film.

The foregoing method for fabrication of semiconductor device is characterized in that one of the dual insulating films contains a pore-forming material of hydrocarbon compound in its skeletal structure so that it has a higher carbon content than the other. The insulating film with a higher carbon content functions as a pseudo-organic film, giving rise to an interface between the dual insulating films (or between the pseudo-organic film and the inorganic film). The resulting interface increases the etching selective ratio of the upper layer to the lower layer for etching in the second step that is performed on the upper layer as far as the lower layer. Thus, the lower insulating film functions as a stopper, thereby improving the fabricating controllability. Moreover, the dual insulating films have the skeletal structure of inorganic material and hence both of them can be formed by CVD process.

The method according to the present invention permits etching on the upper insulating layer to be performed under good control, which leads to a dimensionally accurate wiring structure with wiring material embedded in wiring grooves (in the upper insulating film) and via holes (in the lower insulating film). Moreover, it permits the insulating films to be formed by CVD process. CVD process immediately adapts itself to any film-forming conditions for desired film quality, thereby contributing productivity, and it also gives rise to a compact film with high mechanical strength. In addition, it is capable of forming the dual insulating films continuously.

DETAILED DESCRIPTION OF THE PREFERRED EMBODIMENTS

The embodiments of the present invention will be described in more detail with reference to the accompanying drawings.

First Embodiment

Figure 1:
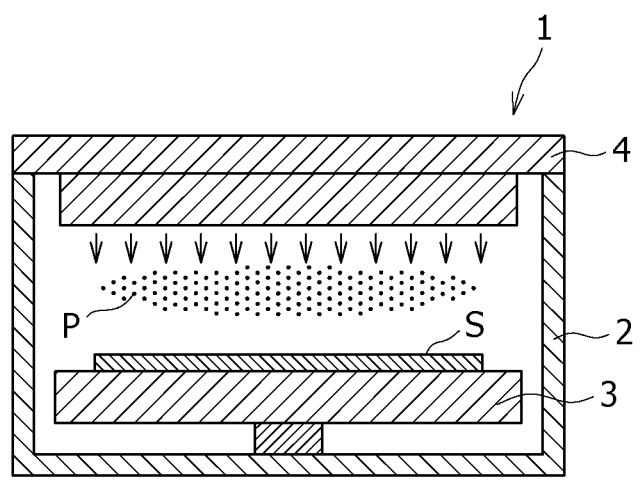
FIG. 1 is a sectional view showing the structure of the CVD apparatus used in the embodiment of the present invention.
Figure 2:
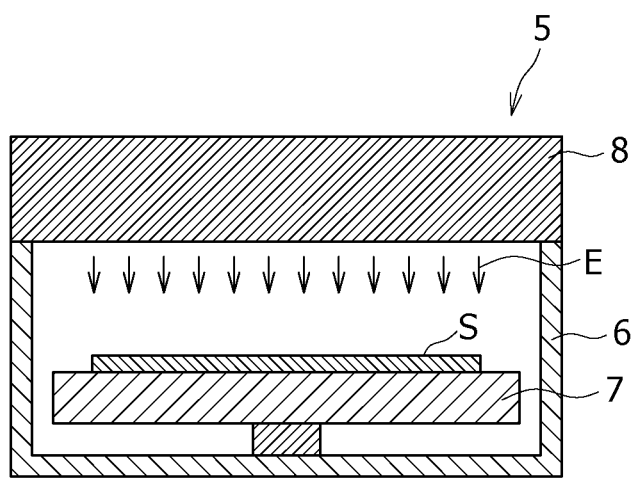
FIG. 2 is a sectional view showing the structure of the electron beam irradiating apparatus used in the embodiment of the present invention.

According to the present invention, the method for fabrication of semiconductor device employs a CVD apparatus and an electron beam irradiating apparatus, which are explained first with reference to FIGS. 1 and 2 (which are sectional views).

The CVD apparatus 1 shown in FIG. 1 (which is used to form insulating films) has a reaction chamber 2 in which films are formed on the surface of the substrate S. The reaction chamber 2 has an exhaust port (not shown) connected to a vacuum pump so that it can be evacuated.

At the bottom of the reaction chamber 2 is a substrate holder 3 on which the substrate S is placed for processing. The substrate holder 3 functions also as a lower electrode to generate plasma (mentioned later), and it is provided with a heater (not shown) that heats the substrate S.

At the top of the reaction chamber 2 is an upper electrode 4, which functions as a lid, opposite to the substrate holder 3. The upper electrode 4 is provided with pipes (not shown) through which film-forming gas and carrier gas are fed into the reaction chamber 2. The upper electrode 4 also has openings in its entire surface opposite to the substrate holder 3 through which the gases are supplied to the surface of the substrate S placed on the substrate holder 3.

Operation of the foregoing CVD apparatus 1 to form an insulating film on the surface of the substrate S involves the steps of placing the substrate S on the substrate holder 3 in the reaction chamber 2, supplying the film-forming gas from the gas supplying openings in the upper electrode 4, and applying a voltage across the electrodes, thereby generating plasma P above the substrate S. The thus generated plasma P causes film-forming components therein to form the insulating film on the surface of the substrate S.

For decomposition and removal the pore-forming material (mentioned later) dispersed in the insulating film, this embodiment employs the electron beam irradiating apparatus 5, which is composed of a reaction chamber 6 in which the substrate S is irradiated with electron beams E. The reaction chamber 6 has on its bottom a substrate holder 7 on which the substrate S is placed and which is provided with a heater (not shown) to heat the substrate S.

At the top of the reaction chamber 6 is an electron beam irradiating unit 8 which emanates electron beams E toward the substrate S placed on the substrate holder 7.

Operation of the foregoing electron beam irradiating apparatus 5 to irradiate the surface of the substrate S with electron beams E involves the steps of placing the substrate S with an insulating film formed thereon which contains a pore-forming material on the substrate holder 7 in the reaction chamber 6 and irradiating the surface of the substrate S with electron beams E.

According to this embodiment, the semiconductor device is fabricated by the steps illustrated in FIGS. 3A to 3F (which are sectional views). The fabricating steps employ the CVD apparatus and electron beam irradiating apparatus illustrated in FIGS. 1 and 2, respectively.

Figure 3A:
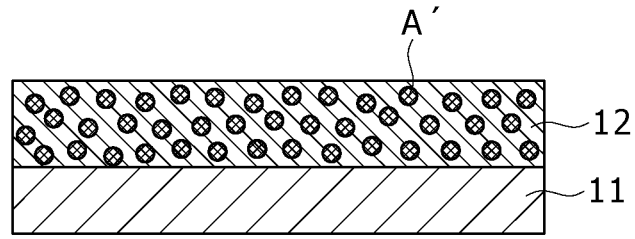
FIGS. 3A to 3F are sectional views showing the steps of fabrication according to the first embodiment of the present invention.

The first step of fabrication illustrated in FIG. 3A involves coating the substrate 11 with the first insulating film 12 of inorganic material containing porogene A' in its skeleton. Porogene A' is a pore-forming material composed of a skeletal material and a hydrocarbon compound. This step involves plasma enhanced chemical vapor deposition (PE-CVD) with a film-forming gas containing porogene A'.

To be concrete, the step of forming the first insulating film 12 starts with introducing the substrate 11 (identical with the substrate S) into the reaction chamber 2 of the CVD apparatus 1 (shown in FIG. 1) to place it on the substrate holder 3 and then heating the substrate holder 3, with the reaction chamber 2 evacuated below 13 kPa.

Next, the reaction chamber 2 is supplied with a film-forming gas and a carrier gas of helium (He), with the former containing a skeleton-forming material composed of diethoxymethylsilane (DEMS) and oxygen ($O_2$) and porogene A', which may be α-terpinene (ATRP), for instance. Then, plasma P is generated by application of RF power across the substrate holder 3 and the upper electrode 4. RF power should be controlled so that the resulting plasma has an energy low enough to prevent porogene A' from dissociation. This step is carried out typically under the condition that the gas flow ratio is DEMS:$O_2$:ATRP:He=1:1:2:5, the RF power is 500 W, the pressure in the reaction chamber is 7.0 kPa, and the substrate temperature is 250° C.

The foregoing procedure gives rise to the first insulating film 12 which is composed of a skeleton of inorganic material (or carbon-containing silicon oxide (SiOC)) and porogene A' (ATRP) dispersed therein in the form of plasma-induced polymer.

The first insulating film 12 thus formed should have a skeleton of inorganic material (not limited to SiOC) having a low dielectric constant. The porogene A' used in this step is not limited to α-terpinene ($C_{10}H_{16}$); it may include any straight or branched hydrocarbon represented by $C_xH_y$ and oxygen-containing hydrocarbon represented by $C_xH_yO_z$, where x is 1 to 12. In addition, the porogene A' should preferably have a cyclic structure like benzene and cyclohexane.

Figure 3B:
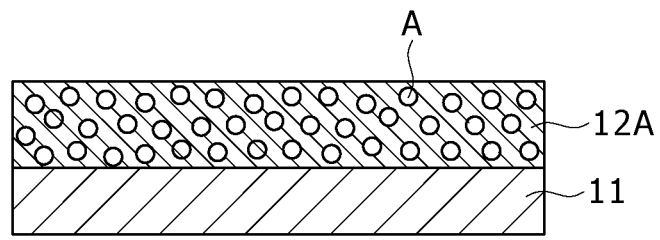

The next step shown in FIG. 3B involves irradiation of the substrate 11 in its heated state with electron beams for decomposition and removal of porogene A' from the first insulating film 12. As the result of this step, the first insulating film 12 shown in FIG. 3A turns into the first porous insulating film 12A having pores A. This step starts with placing the substrate 11 (identical with the substrate S), which has the first insulating film 12 formed thereon, on the substrate holder 7 in the reaction chamber 6 of the electron irradiating apparatus 5 described above with reference to FIG. 2. Then, the surface of the substrate 11 is irradiated with electron beams E emanating from the electron beam irradiating unit 8, with the substrate holder 7 heated at, say, 400° C.

Figure 3C:
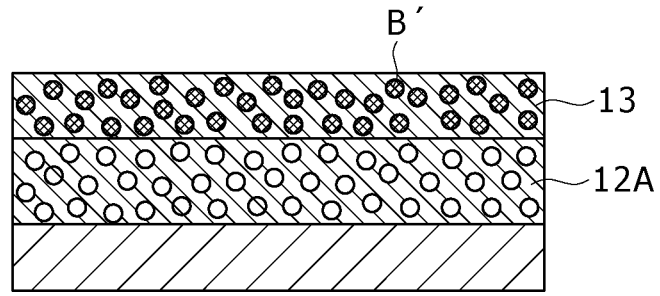

The third step shown in FIG. 3C involves PE-CVD process which forms on the first porous insulating film 12A the second insulating film 13 of inorganic material containing porogene B' in its skeleton upon receipt of the film-forming gas containing a skeleton-forming material and porogene B' of hydrocarbon compound.

The second insulating film 13 thus formed contains porogene B' of hydrocarbon compound and hence has a higher carbon content than the first porous insulating film 12A. The fact that the content of porogene B' in the second insulating film 13 is higher than the content of porogene A' in the first insulating film 12 (shown in FIG. 3A) leads to the higher carbon content in the first porous insulating film 12A and this is desirable. Porogene B' may be a hydrocarbon compound as in the case of porogene A'.

The third step employs the CVD apparatus 1 which has been described above with reference to FIG. 1. It starts with introduction of a film-forming gas and a carrier gas (He) into the reaction chamber 2, with the former being composed of a skeleton-forming material of DEMS and porogene B' of ATRP, which is followed by application of RF power across the substrate holder 3 and the upper electrode 4 to generate plasma P. RF power should have an energy low enough to prevent porogene B' from dissociation. The desirable condition for this step is that the gas flow rate is DEMS:ATRP: He=1:6:5, the RF power is 500 W, the pressure in the reaction chamber 2 is 13 kPa, and the substrate temperature is 250° C. This condition differs from that for the first insulating film 12 in that the ratio of ATRP (porogene B') to DEMS is higher and DEMS is used alone to form the skeleton. The result is that the skeleton has a higher carbon content.

The third step carried out as mentioned above forms the second insulating film 13 which is composed of a skeleton of inorganic material and porogene B' dispersed therein. The inorganic material constituting the skeleton is carbon-containing silicon oxide (SiOC) which has a higher carbon content than the first insulating film 12. The porogene B' is ATRP which has been polymerized by plasma. The thus formed second insulating film 13 contains porogene B' more than the first insulating film 12 contains porogene A'. Containing porogene B', the second insulating film 13 is a pseudo-organic film.

Figure 3D:
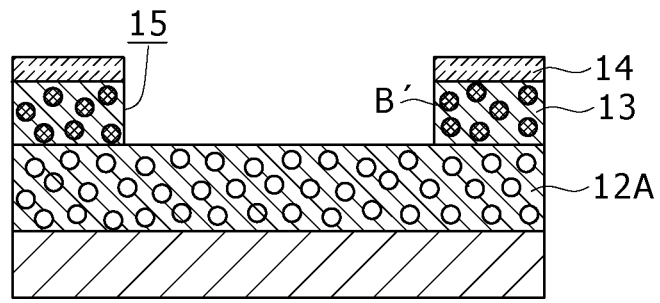

In the fourth step shown in FIG. 3D, the second insulating film 13 undergoes etching through the first mask pattern 14 previously formed thereon. This etching forms the wiring groove 15 that penetrates the second insulating film 13 and reaches the first porous insulating film 12A. Incidentally, the first mask pattern 14 should be formed from an inorganic material, such as silicon oxide ($SiO_2$), because the second insulating film 13 is a pseudo-organic film.

Etching mentioned above should preferably use, as an etching gas, ammonia ($NH_3$) which is used to etch carbonaceous film, because of the high content of porogene B' of hydrocarbon compound in the second insulating film 13. The result of etching in this manner is a high etching selective ratio of the second insulating film 13 to the first porous insulating film 12A. An example of the desirable etching condition is as follows. Etching gas: $NH_3$ and $O_2$; gas flow rate: $NH_3:O_2$=30: 1; bias power: 400 W; and substrate temperature: 0° C. The two-component etching gas may be replaced by $NH_3$ alone.

Etching in this manner gives rise to a pseudeo-inorganic-organic interface between the first porous insulating film 12A and the second insulating film 13 (which is a pseudo-organic film). This interface contributes to the high etching selective ratio of the second insulating film 13 to the first porous insulating film 12A. The result is well-controlled etching on the second insulating film 13. The fourth step finishes with removal of the first mask pattern 14.

Figure 3E:
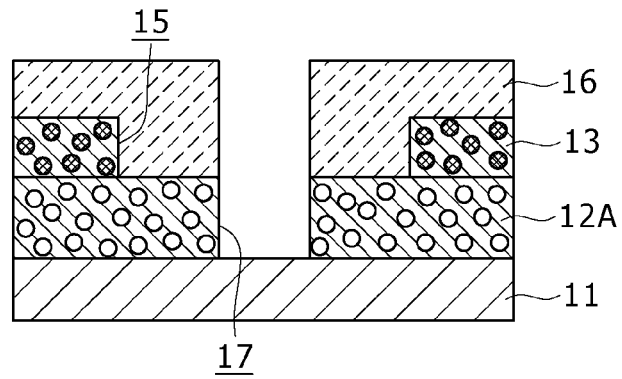

The fifth step shown in FIG. 3E starts with coating the second insulating film 13 with a photoresist forming the second mask pattern 16. Then, the first porous insulating film 12A which is exposed at the bottom of the wiring groove 15 undergoes etching through the second mask pattern 16. This etching forms the connecting hole 17 in the first porous insulating film 12A. An example of the etching condition is as follows.

Etching gas: a mixture of octafluorocyclobutane ($C_4F_8$), carbon monoxide (CO), nitrogen ($N_2$), and argon (Ar);
Gas flow rate: $C_4F_8:CO:N_2:Ar$=3:10:200:500;
Bias power: 1000 W;
Substrate temperature: 20° C.

This step may optionally include removal of the second mask pattern 16.

Figure 3F:
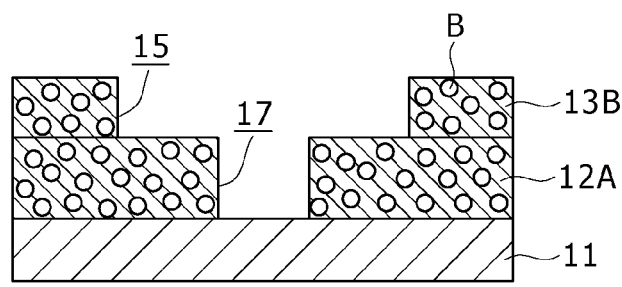

The sixth step shown in FIG. 3F is irradiation with electron beams, with the substrate 21 heated, for decomposition and removal of porogene B' contained in the second insulating film 13. The result is a conversion of the second insulating film 13 shown in FIG. 3E into the second porous insulating film 13B which has pores B. This step involves heating in the reaction chamber 6 of the electron beam irradiating apparatus 5 the substrate holder 7 (at, say, 400° C.) supporting thereon the substrate 11 with the second insulating film 13 and irradiation of the substrate 11 with electron beams E emanating from the electron beam irradiating unit 8 for, say, five minutes.

Incidentally, this embodiment may be modified by replacing irradiation with electron beams by irradiation with ultraviolet rays for decomposition and removal of porogene A' and porogene B', respectively in the first insulating film 12 and the second insulating film 13, with the substrate 21 heated. The same effect will also be achieved by heating only.

The forgoing step is followed by a finishing step (not shown) of filling the wiring groove 15 and the connecting hole 17 with an electrically conductive material, thereby forming vias and wirings connected to the substrate 11.

Fabrication of semiconductor devices in the way mentioned above causes the second insulating film 13 to contain more carbon than the first porous insulating film 12A because the second insulating film 13 containing porogene B' is formed on the first porous insulating film 12A. The result is a high etching selective ratio of the second insulating film 13 to the first porous insulating film 12A. Thus the first porous insulating film 12A functions as a stopper, allowing the wiring groove 15 and the connecting hole 17 to be formed accurately. This, in turn, allows the wiring and via to be formed accurately in the wiring groove 15 and the connecting hole 17, respectively.

The CVD process employed to form both of the first insulating film 12 and the second insulating film 13 is flexible to cope with film quality fluctuation. It gives a compact film with high mechanical strength and contributes to improved productivity.

Figure 4:
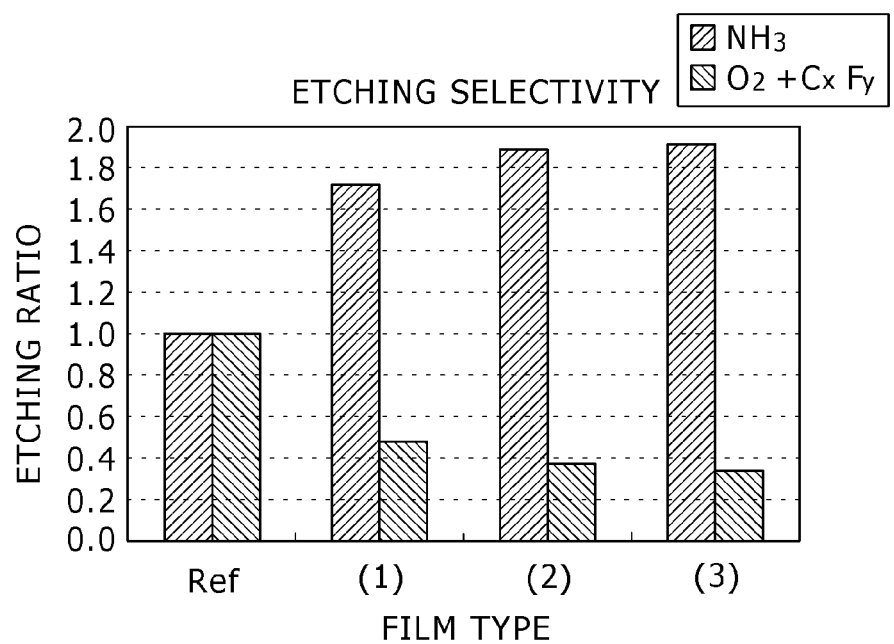
FIG. 4 is a graph showing the etching selective ratio of the second insulating film to the first insulating film in the first embodiment of the present invention.

Meanwhile, FIG. 4 shows the etching selective ratio of the second insulating film 13 (or the second porous insulating film 13B) to the first porous insulating film 12A, which has been explained above with reference to FIGS. 3A to 3F. "Ref" on the abscissa denotes the first porous insulating film 12A arising from the first insulating film 12 after irradiation with electron beams for five minutes under heated condition at 400° C. Likewise, (1) denotes the second porous insulating film 13B arising from the second insulating film 13 after irradiation with electron beams for five minutes under heated condition at 400° C. (2) denotes the second porous insulating film 13B arising from the second insulating film 13 after heat treatment at 400° C. for five minutes. (3) denotes the second insulating film 13. These three films vary in carbon content such that (1)<(2)<(3). Etching selective ratio was measured by etching in two ways, one with $NH_3$ which is used to etch a carbonaceous film, and the other with a combination of $O_2$ and $C_xF_y$, which is used to etch an SiOC film. Etching with $NH_3$ showed a sign of the etching selective ratio of the second porous insulating film 13B (or the second insulating film 13) to the first porous insulating film 12A increasing in proportion to the carbon content. By contrast, etching with an oxygen-containing gas (such as $O_2$ and CO) plus $C_xF_y$ showed a sign of the etching selective ratio decreasing in proportion of the carbon content. These results prove that etching with $O_2$ and $C_xF_y$ gives a high etching selective ratio of the first porous insulating film 12A (with a low carbon content) to the second insulating film 13 or the second porous insulating film 13B (both with a high carbon content).

As compared with the first porous insulating film 12A indicated by "Ref", the second porous insulating film 13B has a higher etching selective ratio in (1). A probable reason for this is that the skeleton of the second insulating film 12 contains more carbon when the first insulating film 12 and the second insulating film 13 are formed under certain conditions and that the content of porogene B' in the second insulating film 13 is higher than that of porogene A' in the first insulating film 12 and hence porogene B' remains unremoved when the step for removal is carried out under the same condition.

The first embodiment mentioned above is designed to form the wiring groove 15 in the second insulating film 13 and then form the connecting hole 17 in the first porous insulating film 12A. However, it is also possible to form the connecting hole 17 in the first porous insulating film 12A and then form the wiring groove 15 in the second insulating film 13.

Although the first embodiment mentioned above assumes that the lower layer under the second insulating film 13 is a porous insulating film, the lower layer may be replaced by a non-porous SiOC film. In this case, the first insulating film 12 does not need irradiation with electron beams. This means that CVD process can be used to form the first insulating film 12 and the second insulating film 13 consecutively, thereby further improving productivity.

Modified Embodiment 1

The first embodiment mentioned above involves a step of etching the second insulating film 13 which contains porogene B' and hence has a higher carbon content than the first porous insulating film 12. However, it may be modified such that etching is performed on the second insulating film 13, with the first insulating film 12 containing porogene A' and hence having a higher carbon content than the second insulating film 13.

Figure 5A:
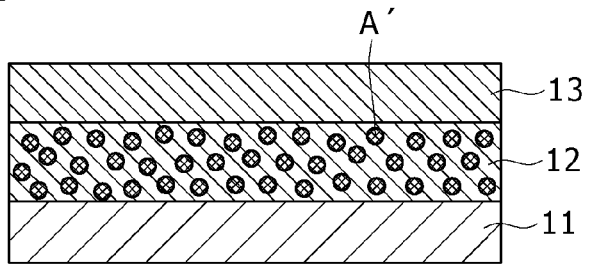
FIGS. 5A to 5D are sectional views showing the steps of fabrication in the first modified embodiment of the present invention.

The first step, shown in FIG. 5A, starts with forming the first insulating film 12 containing porogene A' on the substrate 11 in the same way as the second insulating film 13 is formed as explained with reference to FIG. 3C in the first embodiment. In other words, porogene A' is ATRP and an adequate film forming condition is selected to prevent porogene A' from dissociation. Subsequently, the first insulating film 12 is coated with the second insulating film 13, which is a non-porous SiOC film. The first insulating film 12 has a higher carbon content than the second insulating film 13 owing to porogene A' contained therein, and hence it behaves like a pseudo-organic film.

Figure 5B:
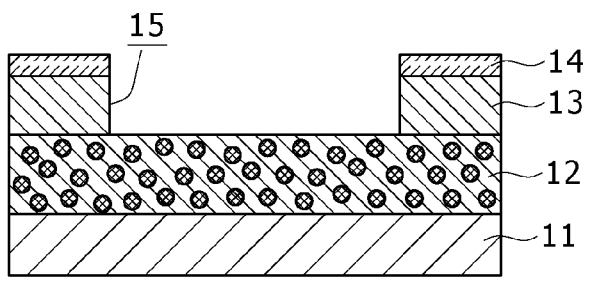

In the next step shown in FIG. 5B, the second insulating film 13 is coated with the first mask pattern 14 of resist and etching down to the first insulating film 12 is performed through the mask pattern 14, so that the wiring groove 15 is formed in the second insulating film 13.

The etching gas used in this step is a mixture of oxygen-containing gas (such as $O_2$ and CO) and fluorinated carbon ($C_xF_y$). As explained above with reference to FIG. 4, this etching gas gives a high etching selective ratio for the inorganic film with a low carbon content. An example of etching condition is as follows.

Etching gas: a mixture of $C_4F_8$, CO, $N_2$, and Ar
Gas flow rate: $C_4F_8$:CO:$N_2$:Ar=3:10:200:500
Bias power: 1000 W
Substrate temperature: 20° C.

Etching in this manner has a high etching selective ratio of the second insulating film 13 to the first insulating film 12 on account of the interface between the first insulating film 12, which is a pseudo-organic film, and the second insulating film 13, which is an inorganic film. Therefore, etching on the second insulting film 13 is carried out under good control. Etching is followed by removal of the first mask pattern 14.

Figure 5C:
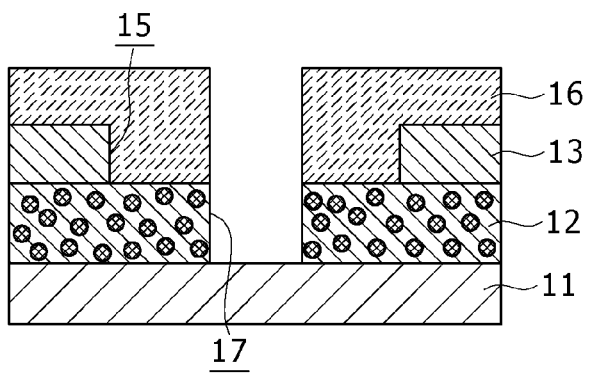

The third step show in FIG. 5C involves forming the second mask pattern 16 of $SiO_2$ or the like on the second insulating film 13 and performing etching through the second mask pattern 16 on the first porous insulating film 12A which has been exposed at the bottom of the wiring groove 15, thereby making the connecting hole 17 in the first insulating film 12. An example of etching condition is as follows.

Etching gas: a mixture of $NH_3$ and $O_2$
Gas flow rate: $NH_3$:$O_2$=30:1
Bias power: 400 W
Substrate temperature: 0° C.

Etching may optionally be followed by removal of the second mask pattern 16.

Figure 5D:
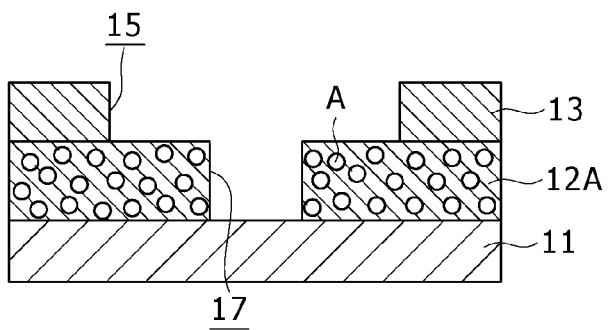

The fourth step shown in FIG. 5D involves irradiation of the substrate 21 in its heated state with electron beams to make the first insulating film 12 free of porogene A' by decomposition. This step converts the first insulating film 12 (shown in FIG. 5C) into the first porous insulating film 12A having pores A.

The foregoing method for fabrication of semiconductor device also produces the effect of increasing the etching selective ratio of the second insulating film 13 to the first insulating film 12 because the latter has a higher carbon content than the former in consequence of the second insulating film 13 of SiOC formed on the first insulating film 12 containing porogene A'. As the result, the first insulating film 12 functions as a stopper, allowing for well-controlled etching for the wiring groove 15 and the connecting hole 17. In addition, CVD process can be used to form both the first insulating film 12 and the second insulating film 13. In conclusion, this modified version produces the same effect as the original version of the first embodiment.

Incidentally, this modified embodiment 1 may be so changed as to replace the second insulating film 13 of SiOC by the second porous insulating film 13B having pores B, which is produced when the previously formed second insulating film 13 containing porogene B' is freed of porogene B' by decomposition. It is necessary that porogene B' have a lower dissociation energy than porogene A' so that the step of forming the second porous insulating film 13B is carried out under the condition that only porogene B' is selectively removed by decomposition.

Modified embodiment 2

The first embodiment (original) mentioned above may have its third step (shown in FIG. 3C) modified such that the second insulating film 13 is formed by applying an RF power that generates plasma with a higher energy than the dissociation energy of porogene B' instead of applying an RF power so adjusted as to prevent porogene B' from dissociation. The thus generated plasma allows partial dissociation of porogene B', thereby giving rise to skeletons of SiOC having carbon (resulting from dissociation) attached thereto and also containing partially dissociated porogene B'. The RF power should be 800 to 1500 W. The resulting second insulating film 13 has skeletons with a high carbon content. This leads to a high etching selective ratio with respect to the first porous insulating film 12A even in the case where the second insulating film 13 is freed of porogene B' by decomposition for conversion into the second porous insulating film 13B, which subsequently undergoes etching to form the wiring groove 15 therein. Moreover, the resulting second insulating film 13B has a high strength owing to its skeletons with carbon attached thereto.

The procedure mentioned above is also applicable to the step explained with reference to FIG. 5A in modified embodiment 1. In other words, the first insulating film 12 may have the skeletal structure which is composed of SiOC with carbon attached thereto arising from partial dissociation of porogene A' due to plasma with a higher energy than the dissociation energy of porogene A, and which contains partially dissociated porogene A'.

Second Embodiment

The second embodiment is illustrated in FIGS. 6A to 6F, which are sectional views. It is intended to form an etched porous insulating film of laminate structure.

Figure 6A:
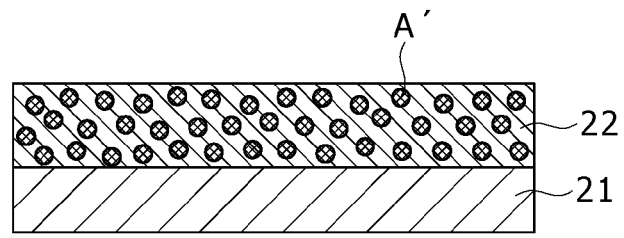
FIGS. 6A to 6F are sectional views showing the steps of fabrication according to the second embodiment of the present invention.
Figure 6B:
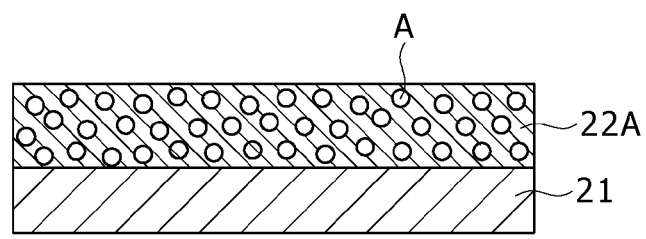

The first and second steps shown in FIGS. 6A and 6B are identical with the procedure explained with reference to FIGS. 3A and 3B in the first embodiment. The first step starts with coating the substrate 21 with the first insulating film 22 containing porogene A' in its skeletal structure. The second step involves irradiating the substrate 21 in its heated state with electron beams to make the first insulating film 22 free of porogene A' by decomposition, for conversion of the first insulating film 22 (shown in FIG. 6A) into the first porous insulating film 22A with pores A (shown in FIG. 6B).

Figure 6C:
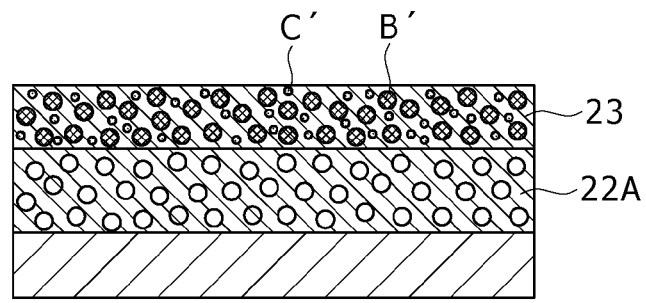

The third step shown in FIG. 6C involves PE-CVD to coat the first porous insulating film 22 with the second insulating film 23 which forms from a gas composed of a skeleton-forming material, porogene B' (as a pore-forming material of hydrocarbon compound), and porogene C' (as a micropore-forming material of hydrocarbon compound with a lower molecular weight than porogene B').

Porogene B' and porogene C' are hydrocarbons represented by $C_xH_y$, or oxygen-containing hydrocarbons represented by $C_xH_yO_z$, with the former having a larger carbon number than the latter. For example, hydrocarbons for porogene B' may be cyclic ones with a carbon number (x) of 6 to 12, and hydrocarbons for porogene C' may be those having a carbon number (x) of 1 to 5. In this embodiment, porogene B' is ATRP and porogene C' is ethylene ($C_2H_4$). Propylene ($C_3H_6$) will also find use as porogene C'. An adequate film-forming condition should be selected, with RF power properly controlled to prevent porogene C' from dissociation, because porogene C' has a lower dissociation energy than porogene B'.

The film-forming process proceeds in the reaction chamber 2 of the CVD apparatus 1 (shown in FIG. 1) which is supplied with DEMS as a skeleton-forming material, ATRP as porogene B', ethylene ($C_2H_4$) as porogene C', and helium as a carrier gas. The gas in the reaction chamber 2 is excited by plasma P arising from RF power applied across the substrate holder 3 and the upper electrode 4. The third step proceeds under the following condition.

Gas flow rate: DEMS:ATRP:$C_2H_4$:He=1:6:2:5
RF power: 500 W
Pressure in the reaction chamber 2: 13 kPa
Substrate temperature: 250° C.

The reaction in this manner yields the second insulating film 23 whose skeleton of SiOC contains dispersed therein porogene B' and porogene C' which have been polymerized by plasma. The content of porogene B' has a limit beyond which the film cannot be formed. However, porogene C', which has a lower molecular weight than porogene B', can be added even when the content of porogene B' is at a limit. Consequently, the film-forming gas containing porogene C' yields the second insulating film 23 with a higher carbon content than the second insulating film 13 containing porogene B' alone, which has been explained with reference to FIG. 3C in the first embodiment. The result is a higher etching selective ratio of the second insulating film 23 to the first porous insulating film 22A.

Figure 6D:
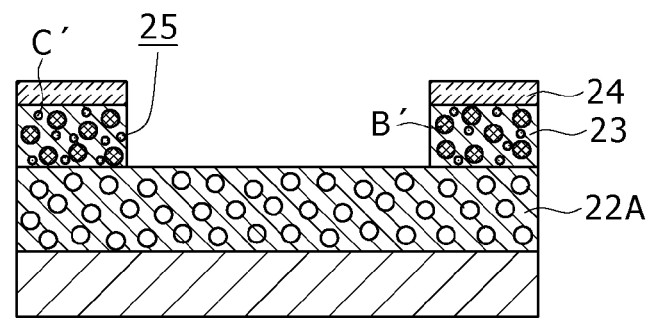

The fourth step shown in FIG. 6D involves coating the second insulating film 23 with the first mask pattern 24 of $SiO_2$ and etching through this mask pattern to form the wiring groove 25 in the second insulating film 23 down to the first porous insulating film 22A. This etching is performed under the same condition as in the step explained with reference to FIG. 3D in the first embodiment.

The second insulating film 23 functions as a pseudo-organic film because of porogene B' and porogene C' of hydrocarbon compounds contained therein, with the result that an interface occurs between the first porous insulating film 22A (as a pseudo inorganic film) and the second insulating film 23 (as a pseudo organic film). The interface contributes to high etching selective ratio of the second insulating film 23 to the first porous insulating film 22A, and the first porous insulating film 22A functions as a stopper allowing for well-controlled etching on the second insulating film 23. This etching is followed by removal of the second mask pattern 24.

Figure 6E:
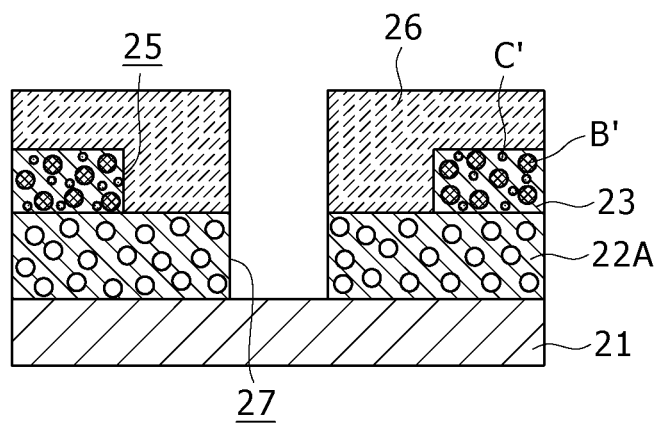

The fifth step shown in FIG. 6E involves forming the second mask pattern 26 of resist on the second insulating film 23 and etching through this mask pattern on the first porous insulating film 22A exposed at the bottom of the wiring groove 25. This etching is carried out under the same condition as in the step explained with reference to FIG. 3E in the first embodiment. This step makes the connecting hole 27 in the first porous insulating film 22A. This etching is followed by removal of the second mask pattern 26 according to need.

Figure 6F:
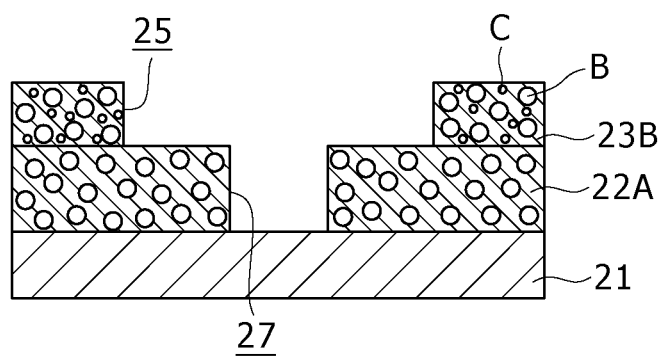

The sixth step shown in FIG. 6F involves irradiating the substrate 21 in its heated state with electron beams to make the second insulating film 23 free of porogene B' and porogene C' by decomposition, for conversion of the second insulating film 23 (shown in FIG. 6E) into the second porous insulating film 23B with pores B and pores C (smaller than pore B in diameter). The second insulating film 23 has a high pore content because it contains more porogene than the second insulating film 13 containing porogene B' alone as explained with reference to FIG. 3C in the first embodiment, and hence the resulting second porous insulating film 23B has a lower dielectric constant than the second porous insulating film 13B shown in FIG. 3F.

The foregoing steps are completed by filling the wiring groove 25 and the connecting hole 27 with an electrically conductive material and by forming vias and interconnects leading to the substrate 21.

The foregoing method for fabrication of semiconductor device also produces the effect of increasing the etching selective ratio of the second insulating film 23 to the first porous insulating film 22A if the latter is coated with the former containing porogene B' and porogene C' (and hence containing more carbon than the latter). The second insulating film 23 in this embodiment contains more carbon than expected in the first embodiment, and this contributes to the higher etching selective ratio for the first porous insulating film 22A, which permits the wiring groove 25 and the connecting hole 27 to be made by well-controlled etching. Therefore, the wiring of wiring groove 25 and vias of the connecting hole 27 are formed with good sizing controllability.

Moreover, this embodiment yields the second porous insulating film 23B which contains more pores than the second porous insulating film 13B (shown in FIG. 3F) in the first embodiment. The high pore content contributes to further reduction of dielectric constant and hence reduction of wiring capacitance.

Since this embodiment resorts to CVD to form both the first insulating film 22 and the second insulating film 23, it produces the same effect as the first embodiment.

Modified Embodiment 3

Figure 7A:
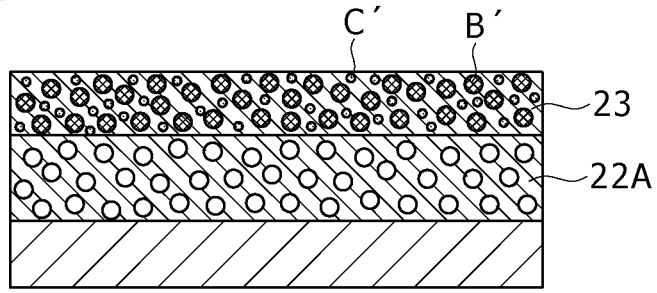
FIGS. 7A to 7D are sectional views showing the steps of fabrication in the third modified embodiment of the present invention.
Figure 7B:
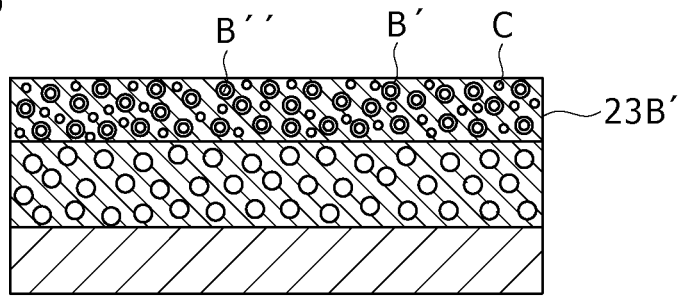

This is a modification of the second embodiment. The first step shown in FIG. 7A starts with coating the first porous insulating film 22A with the second insulting film 23. The second step shown in FIG. 7B involves heat treatment at 300° C. for 0.5 hours to form the second porous insulating film 23B' which has only porogene C' removed by decomposition but contains pores B" resulting from the polymerized porogene B' with its central part removed by decomposition.

Figure 7C:
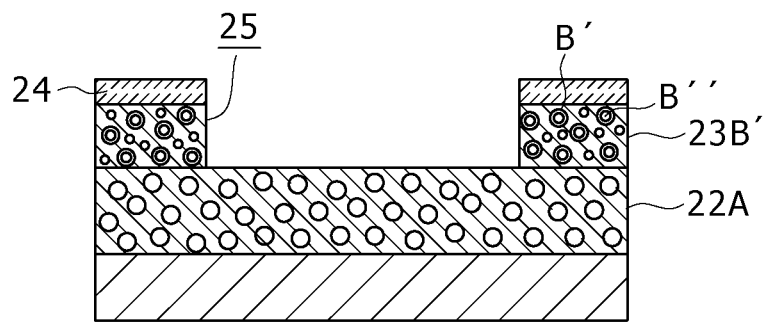

The third step shown in FIG. 7C involves coating the second porous insulating film 23B' with the first mask pattern 24 and subsequent etching to form the wiring groove 25 in the second porous insulating film 23B'. Due to residual porogene B', this etching is possible with a high etching selective ratio with respect to the first porous insulating film 22A. Since the second porous insulating film 23B' has pores C (which are left after porogene C' of low-molecular weight hydrocarbons has been removed by decomposition) and pores B" (which are left after polymerized porogene B' has been partly removed by decomposition), and pores B" have a small size and are surrounded by residual porogene B', etching on it causes less damage than etching on a porous film with porogene B' and C' completely removed.

Figure 7D:
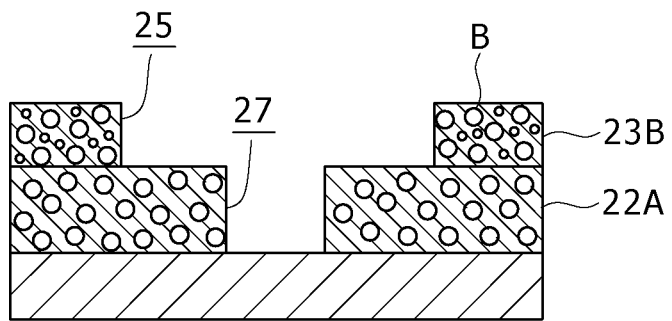

The fourth step shown in FIG. 7D involves making the connecting hole 27 in the first porous insulating film 22A exposed at the bottom of the wiring groove 25 and additional heat treatment at 400° C. for 0.5 hours for removal of the residual porogene B' (see FIG. 7C) by decomposition. This heat treatment converts the second porous insulating film 23B' into the second porous insulating film 13B having pores B formed therein. This modified embodiment is designed to remove porogene B' and porogene C' in two stages for their complete removal.

The foregoing method for fabrication of semiconductor device also produces the same effect as the first embodiment because it involves etching on the second insulating film 23 containing more carbon than the first porous insulating film 22A and etching in this manner has a high etching selective ratio.

Modified Embodiment 4

The second embodiment mentioned above, which involves etching on the second insulating film 23 containing more carbon than the first porous insulting film 22A on account of porogene B' and porogene C' contained therein, may be modified by application of modified embodiment 1.

Figure 8A:
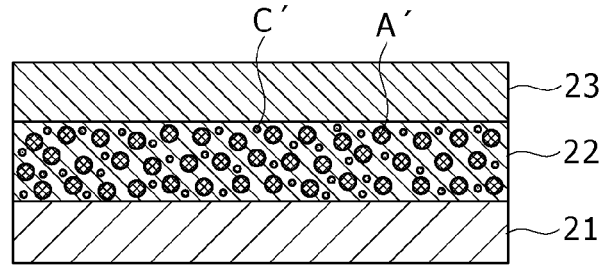
FIGS. 8A to 8D are sectional views showing the steps of fabrication in the fourth modified embodiment of the present invention.

According to the modified embodiment 4, the first step shown in FIG. 8A starts with coating the substrate 11 with the first insulating film 22 containing porogene A' and porogene C' under the same condition as that for the second insulating film 23 shown in FIG. 6C in the second embodiment mentioned above. Porogene A' is ATRP and porogene C' is $C_2H_4$. The film-forming condition should be adequate to prevent porogene C' from dissociation. The foregoing step is followed by coating the first insulating film 22 with the second insulating film 23 which is a non-porous SiOC film. The thus formed first insulating film 22, which contains porogene A', has a higher carbon content than the second insulating film 23, and hence it functions as a pseudo-organic film. The second insulating film 23 of SiOC may be replaced by the second porous insulating film 23B having pores B therein as in the modified embodiment 1.

Figure 8B:
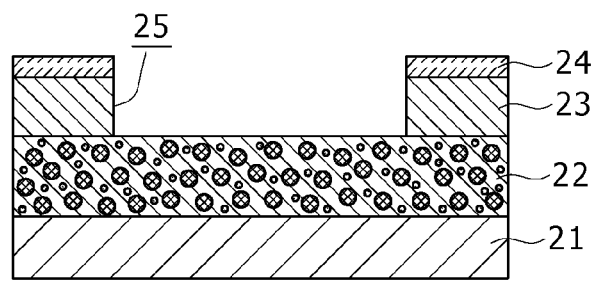

The second step shown in FIG. 8B, which proceeds in the same way as in the modified embodiment 1 mentioned above, involves coating the second insulating film 23 with the first mask pattern 24 and etching through the first mask pattern 24 to make the wiring groove 25 (which reaches the first insulating film 22) in the second insulating film 23. The etching conditions are the same as those in the modified embodiment 1 explained with reference to FIG. 5B. This etching exhibits a high etching selective ratio of the second insulating film 23 to the first insulating film 22 owing to an interface between them (or between a pseudo organic film and an inorganic film); the result is well-controlled etching of the second insulating film 23. The foregoing step is followed by removal of the first mask pattern 24.

Figure 8C:
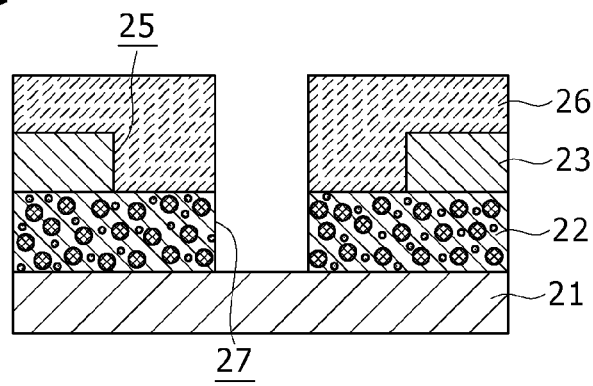

The third step shown in FIG. 8C involves coating the second insulating film 23 with the second mask pattern 26 and etching through the second mask pattern 26 to make the connecting hole 27 in the first insulating film 22 exposed at the bottom of the wiring groove 25. The etching conditions are the same as those in the step explained with reference to FIG. 5C. The foregoing step is followed by removal of the first mask pattern 26 according to need.

Figure 8D:
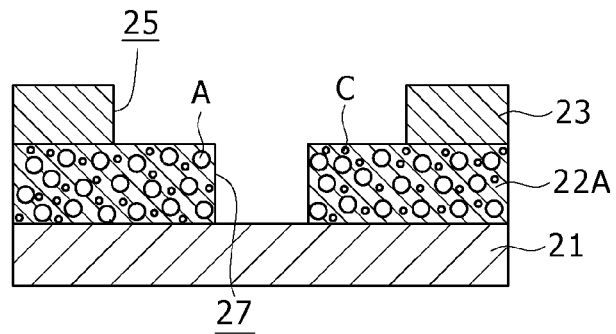

The fourth step shown in FIG. 8D involves irradiation of the substrate 21 in its heated state with electron beams to make the first insulating film 22 free of porogene A' and porogene C' by decomposition. This step converts the first insulating film 22 (see FIG. 8C) into the first porous insulting film 22A having pores A.

The foregoing method for fabrication of semiconductor devices also produces the same effect as the second embodiment because of the specific layer structure composed of the first insulating film 22 containing porogene A' and porogene C' and the second insulating film 23 of SiOC formed thereon. This layer structure results in a higher carbon content in the first insulating film 22 than in the second insulating film 23 and hence a high etching selective ratio of the latter to the former. Thus, the first insulating film 22 functions as a stopper which permits the wiring groove 25 and the connecting hole 27 to be made by etching under good control. In addition, CVD process may be employed to form both the first insulating film 22 and the second insulating film 23.

Modified Embodiment 5

The second embodiment and the modified embodiment 3 both mentioned above are designed such that the second insulating film 23 is formed with an adequate RF power which prevents porogene C' from dissociation. However, they may be modified such that the RF power is so controlled as to generate plasma having a higher energy than the dissociation energy of the porogene C' and a lower energy than the dissociation energy of porogene B'. The resulting second insulating film 23 has the skeletal structure containing porogene B' and having carbon attached thereto which arises from dissociated porogene C'. Subsequent removal of porogene B' by decomposition converts the second insulating film 23 into the second porous insulating film 13B having pores B. The result is that the skeleton has a high carbon content owing to the dissociated carbon attached thereto. This high carbon content is responsible for high strength and pores B contribute to the second porous insulating film 13B having a low dielectric constant.

Moreover, the second insulating film 23 may also be formed by properly adjusting the RF power so that the generated plasma has a higher energy than the dissociation energy of porogene B' and hence dissociates not only porogene C' but also part of the porogene B'. Therefore, the resulting second insulating film 23 has the skeletal structure which contains dissociated carbon and partly dissociated porogene B'. Finally, the second insulating film 23 is freed of porogene B' for its conversion into the second porous insulating film 23B having pores B. The foregoing procedure produces the skeletal structure containing porogene C' as well as partially dissociated porogene B'. The resulting second porous insulating film 23B has a high strength owing to the high carbon content in its skeletal structure.

The advantage of the foregoing procedure that gives the second insulating film 23 whose skeletal structure has carbon attached thereto originating from porogene C' or both porogene C' and partly dissociated porogene B' is that even though the second insulating film 23 is made porous for conversion into the second porous insulating film 23B, the resulting second porous insulating film 23B keeps the higher carbon content than the first porous insulating film 22A, which allows a high etching selective ratio for the first porous insulating film 22A.

The foregoing may also be applied to the step explained above with reference to FIG. 7A in modified embodiment 4. That is, the first insulating film 22 may be formed by properly adjusting the RF power so that the generated plasma has a higher energy than the dissociation energy of porogene C' and a lower energy than the dissociation energy of porogene A', and the resulting first insulating film 22 has the skeletal structure which contains carbon arising from porogene C' and porogene A'. Similarly, the second insulating film 23 may be formed by properly adjusting the RF power so that the generated plasma has a higher energy than the dissociation energy of porogene A' and its skeletal structure contains carbon arising from porogene C' as well as partly dissociated porogene A'.

Third embodiment

The third embodiment illustrated in FIGS. 9A to 9L (sectional views) is concerned with the dual damascene method to which the present invention is applied. Incidentally, it is based on the first embodiment explained above with reference to FIGS. 3A to 3F.

Figure 9A:
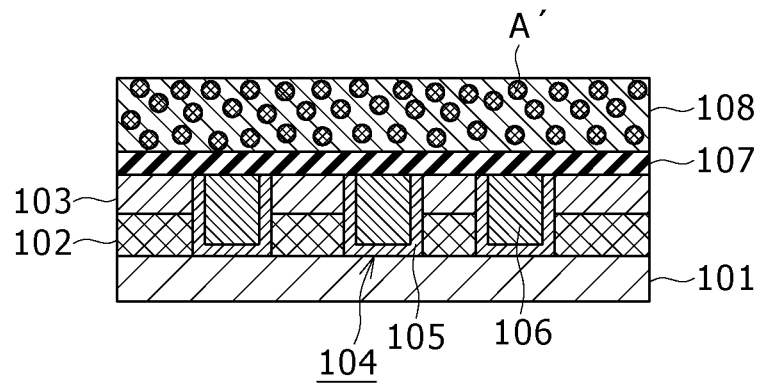
FIGS. 9A to 9L are sectional views showing the steps of fabrication according to the third embodiment of the present invention.

The first step shown in FIG. 9A starts with coating the semiconductor substrate 101 (having element regions (not shown) formed thereon) with the wiring insulating film (which is a laminate layer consisting of the PAE film 102 and the SiOC film 103). The coating step is followed by making the wiring groove 104 in the wiring insulating film and forming the embedded copper wiring 106 in the wiring groove 104, with the barrier metal 105 interposed. The first step is concluded with forming the etch preventing film 107 of SiC on the copper wiring 106 and the SiOC film 103. What is obtained by the foregoing steps corresponds to the substrate described in the claim.

Figure 9B:
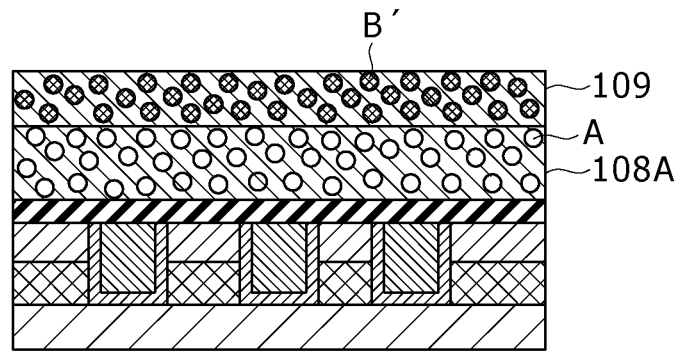

The second step shown in FIG. 9B involves coating the etch preventing film 107 with the first insulating film 108 whose skeleton contains porogene A' (in the same procedure as explained above with reference to FIGS. 3A to 3C in the first embodiment), irradiating the substrate 101 in its heated state with electron beams, thereby making the first insulating film 108 (see FIG. 9A) free of porogene A' by decomposition for conversion into the first porous insulating film 108A containing pores A, and coating the first porous insulating film 108A with the second insulating film 109 whose skeleton contains porogene B'.

Figure 9C:
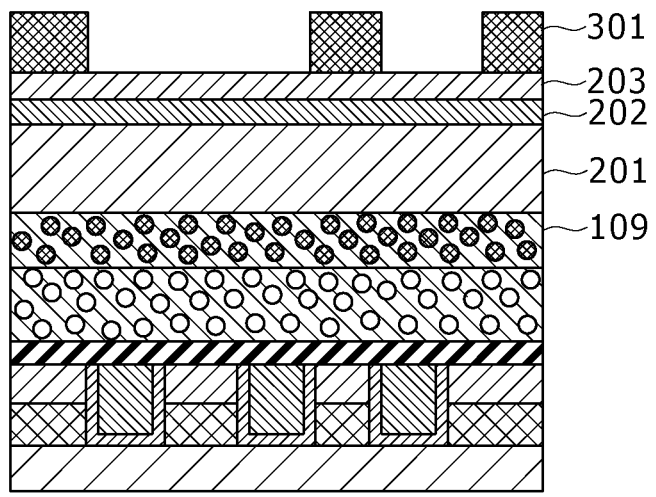

The third step shown in FIG. 9C involves coating the second insulating film 109 sequentially with the first mask-forming layer 201 of silicon oxide ($SiO_2$), the second mask-forming layer 202 of silicon carbide nitride (SiCN), and the third mask-forming layer 203 of silicon oxide ($SiO_2$).

Of the three mask-forming layers 201 to 203, the first and third mask-forming layers 201 and 203 of $SiO_2$ are formed by PE-CVD from monosilane ($SiH_4$) as the silicon source and dinitrogen monoxide ($N_2O$) gas as the oxidizing agent, and the second mask-forming layer 202 of SiCN is formed by PE-CVD. The third mask-forming layer 203 is coated with the resist mask 301 having the wiring groove pattern.

Figure 9D:
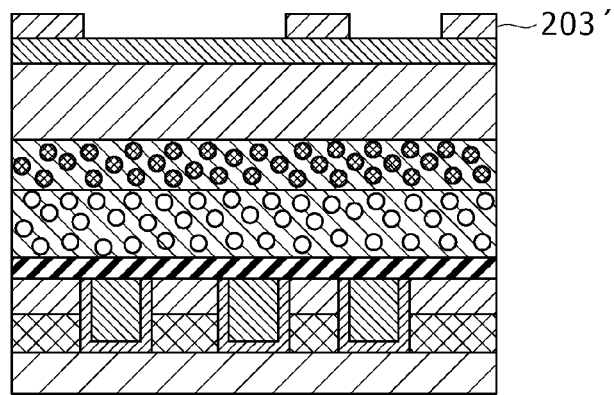

The fourth step shown in FIG. 9D involves dry etching through the resist mask 301 (see FIG. 9C) on the third mask-forming layer 203 (see FIG. 9C) to form the third mask 203' with the wiring groove pattern and ashing with $O_2$ plasma and chemical treatment with an organic amine to completely remove the resist mask 301 and residues arising from etching.

Figure 9E:
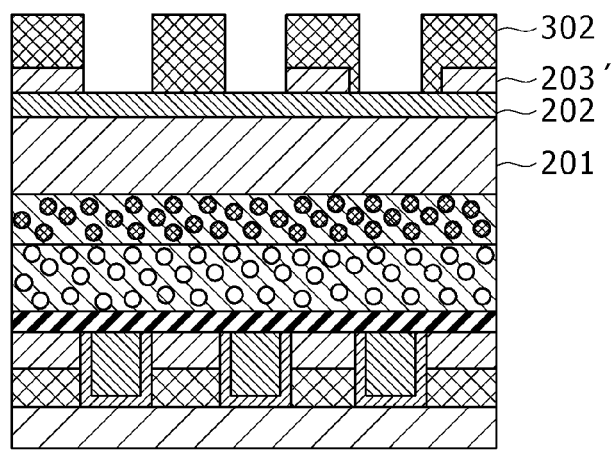

The fifth step shown in FIG. 9E involves coating the second mask-forming layer 202 (having the third mask 203' formed thereon) with the resist mask 302 having the connecting hole pattern. The resist mask 302 is patterned in such a way that the connecting hole pattern in it at least partly overlaps the opening in the wiring pattern of the third mask 203'.

Figure 9F:
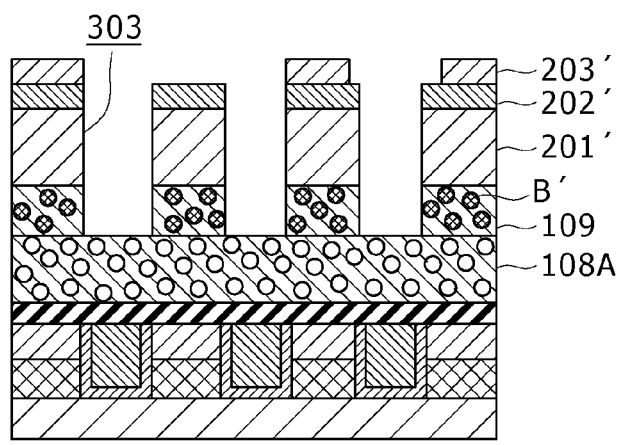

The sixth step shown in FIG. 9F involves dry etching through the resist mask 302 (see FIG. 9E) sequentially on the third mask 203', the second mask-forming layer 202 (see FIG. 9E), the first mask-forming layer 201 (see FIG. 9E), and the second insulating film 109. This etching allows a high etching selective ratio of the second insulating film 109 to the first porous insulating film 108A because the former contains porogene B' dispersed therein in the polymerized form and the latter functions as the stopper. This step gives rise to the connecting hole 303 through which the first porous insulating film 108A is exposed.

Etching in the sixth step also removes the resist mask 302, while leaving the third mask 203', which functions as the mask for the wiring groove pattern. Etching on the second mask-forming layer 202 forms the second mask 202', which functions as the mask for the connecting pattern.

The above-mentioned etching on the third mask (SiO$_2$) 203' to the first mask-forming layer (SiO$_2$) 201 is accomplished by using the ordinary magnetron etching apparatus under the following condition.

Etching gas: trifluoromethane (CHF$_3$), oxygen (O$_2$), and argon (Ar)
Gas flow rate: CHF$_3$:O$_2$:Ar=5:1:50
Bias power: 1000 W
Substrate temperature: 40° C.

Etching on the lower second insulating layer 109 is also accomplished by using the ordinary magnetron etching apparatus under the following condition.

Etching gas: NH$_3$ and O$_2$
Gas flow rate: NH$_3$:O$_2$=30:1
Bias power: 400 W
Substrate temperature: 0° C.

Figure 9G:
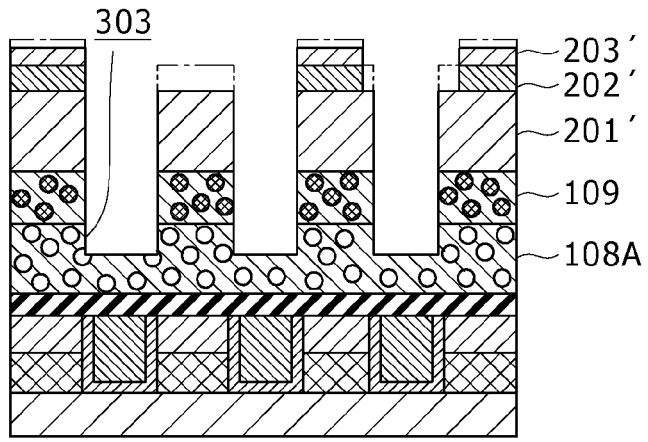

The seventh step shown in FIG. 9G involves dry etching through the third mask (SiO$_2$) 203' on the second mask (SiCN) 202'. The etched second mask 202' functions as the mask for the wiring groove pattern. The first mask-forming layer 201 (see FIG. 9E) turns into the first mask 201' having the connecting hole pattern formed thereon. Etching in this step digs out the first porous insulating film 108A (exposed at the bottom of the connecting hole 303) to the middle thereof, thereby deepening the connecting hole 303.

Figure 9H:
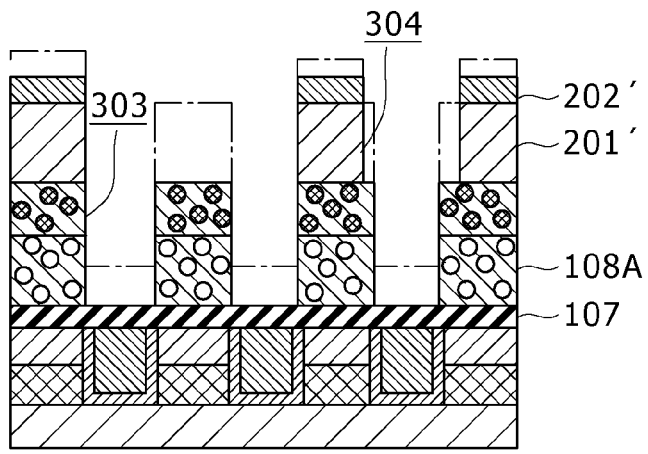

The eighth step shown in FIG. 9H involves etching through the first mask (SiO$_2$) 201' on the lower layer of the first porous insulating film 108A, thereby digging out the connecting hole 303 further for the etching stopper film 107 to be exposed. This step also involves etching on the first mask (SiO$_2$) 201' through the third mask (SiO$_2$) 203' (see FIG. 9G) and the second mask (SiCN) 202', thereby making the wiring groove 304 in the first mask 201'.

The foregoing etching is accomplished by using the ordinary magnetron etching apparatus under the following condition.

Etching gas: octafluorocyclobutane (C$_4$F$_8$), carbon monoxide (CO), nitrogen (N$_2$), and argon (Ar)
Gas flow rate: C$_4$F$_8$:CO:N$_2$:Ar=3:10:200:500
Bias power: 1000 W
Substrate temperature: 20° C.

Figure 9I:
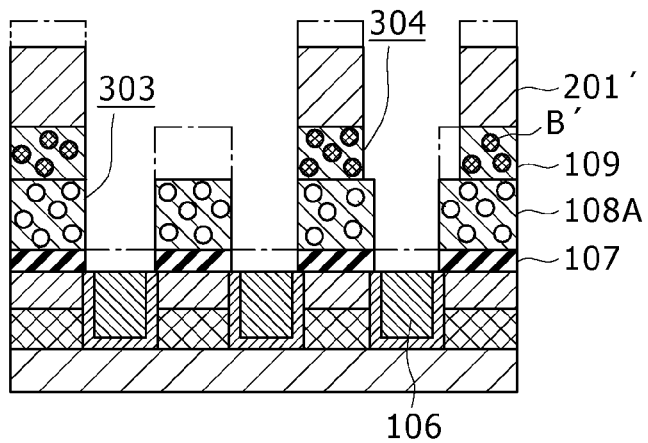
Figure 9J:
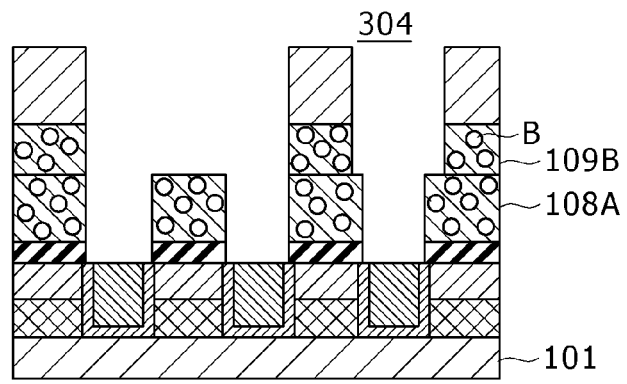
Figure 9K:
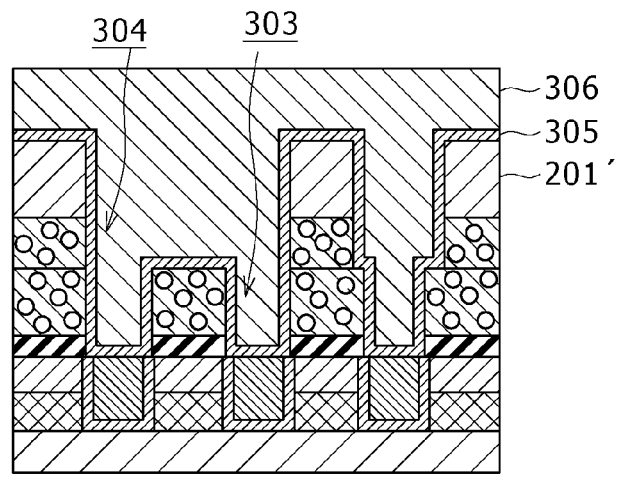

The ninth step shown in FIG. 9I involves etching through the second mask (SiCN) 202' (see FIG. 9H) on the second insulating film 109 containing porogene B' which remains at the bottom of the wiring groove 304. This etching digs out further the wiring groove 304 made in the first mask 201', thereby making the wiring groove 304 in the first mask 201' and the second insulating film 109. This etching allows a high etching selective ratio of the second insulating film 109 to the first porous insulating film 108A because the former contains porogene B' dispersed therein in the polymerized form and the latter functions as the stopper.

The foregoing etching is accomplished by using the ordinary magnetron etching apparatus under the following condition.

Etching gas: NH$_3$ and O$_2$
Gas flow rate: NH$_3$:O$_2$=30:1
Bias power: 400 W
Substrate temperature: 0° C.

Continued etching is performed on the etching stopper film 107 remaining at the bottom of the connecting hole 303 so as to permit the connecting hole 303 opened at the bottom of the wiring groove 304 to communicate with the lower wiring 106. In this way the dual damascene process is completed. This etching is accomplished by using the ordinary magnetron etching apparatus under the following condition.

Etching gas: difluoromethane (CH$_2$F$_2$), oxygen (O$_2$), and argon (Ar)
Gas flow rate: CH$_2$F$_2$:O$_2$:Ar=2:1:5
Bias power: 100 W The tenth step shown in FIG. 9J involves irradiating the substrate 101 in its heated state with electron beams to make the second insulating film 109 free of porogene B' by decomposition, for conversion of the second insulating film 109 (see FIG. 9I) into the second porous insulating film 109B with pores B.

Then, ordinary damascene process follows. That is, the eleventh step shown in FIG. 9K involves sputtering to form the barrier metal 305 of tantalum and electrolytic copper plating or sputtering to fill the wiring groove 304 and the connecting hole 303 with the copper conductive film 306.

Figure 9L:
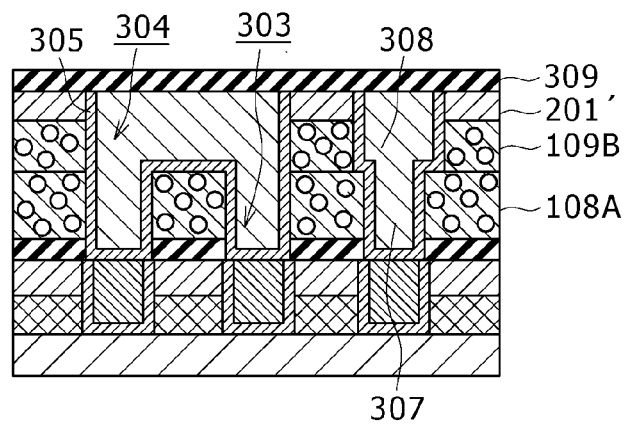

The twelfth step shown in FIG. 9L involves chemical mechanical polishing (CMP) to remove those parts (remaining above the first mask 201') unnecessary for the wiring pattern out of the conductive part 306 (see FIG. 9K) and the barrier metal 305, and making the via 307 in the connecting hole 303 to form the wiring 308 in the wiring groove 304. This step is concluded by forming the stopper film 309 of SiC on the first mask 201' and the top of the wiring 308.

The foregoing steps illustrated in FIG. 9A to 9L are repeated to form the multilayer wiring structure of dual damascene structure.

The foregoing method for fabrication of semiconductor devices produces the same effect as the first embodiment because the first porous insulating film 108A is coated with the second insulating film 109 containing porogene B' in such a way that it contains more carbon than the first porous insulating film 108A and the resulting second insulting film 109 has a high etching selective ratio for the first porous insulating film 108A. An additional reason is that CVD process can be employed to form both the first insulating film 108 and the second insulating film 109.

It should be understood by those skilled in the art that various modifications, combinations, sub-combinations and alterations may occur depending on design requirements and other factor in so far as they are within the scope of the appended claims or the equivalents thereof.

What is claimed is:

1. A method for fabricating a semiconductor device, said method comprising:
   a first step of coating a substrate with a double-layered insulating film in laminate structure, the double-layered insulating film having an upper layer in contact with a lower layer, the upper layer and the lower layer having a skeletal structure of inorganic material; and
   a second step of etching the upper layer of the insulating film as far as to the lower layer of the insulating film,
   wherein,
   the first step is carried out such that the skeletal structure contains a pore-forming material of hydrocarbon compound so that both the upper layer and the lower layer contain carbon, and the upper layer of the insulating film contains more carbon than the lower layer of the insulating film.

2. The method of claim 1, wherein the second step is followed by a step of making one layer of the insulating film free of the pore-forming material by decomposition, thereby forming pores in said insulating film.

3. The method of claim 1, wherein the inorganic material is carbon-containing silicon.

4. The method for fabrication of semiconductor device as defined in claim 1, wherein the first step is carried out to form one layer of the insulating film in such a way that the pore-forming material is incorporated in the skeletal structure containing carbon attached thereto which arises from partial dissociation of the pore-forming material.

5. The method of claim 1, wherein the first step is carried out in such a way that the skeletal structure contains:
   the pore-forming material and
   a micropore-forming material of hydrocarbon compound having a lower molecular weight than said pore-forming material.

6. The method for fabrication of semiconductor device as defined in claim 5, wherein the first and second steps are separated by a step of making one layer of the insulating film free of said micropore-forming material by decomposition and also partly free of said pore-forming material by decomposition, thereby forming pores in said layer of the insulating film and making it porous, and the second step is followed by a step of removing the residual pore-forming material by decomposition.

7. The method for fabrication of semiconductor device as defined in claim 5, wherein the first step is carried out to form one layer of the insulating film in such a way that the pore-forming material is incorporated in the skeletal structure containing carbon attached thereto which arises from dissociation of the pore-forming material.

8. The method for fabrication of semiconductor device as defined in claim 1, wherein the second step involves pattern etching that employs the lower layer of the insulating film as the stopper, thereby making the wiring groove in the upper layer of the insulating film, and also involves pattern etching on the lower layer of the insulating film which is exposed at the bottom of said wiring groove, thereby making the connecting hole in the lower layer of the insulating film.

* * * * *